(12) United States Patent
Kuroki

(10) Patent No.: US 8,111,565 B2
(45) Date of Patent: Feb. 7, 2012

(54) MEMORY INTERFACE AND OPERATION METHOD OF IT

(75) Inventor: Reiko Kuroki, Kanagawa (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 304 days.

(21) Appl. No.: 12/569,383

(22) Filed: Sep. 29, 2009

(65) Prior Publication Data

US 2010/0202223 A1 Aug. 12, 2010

(30) Foreign Application Priority Data

Sep. 30, 2008 (JP) .................. 2008-253989

(51) Int. Cl.
*G11C 7/00* (2006.01)

(52) U.S. Cl. ............... 365/193; 365/194; 365/189.14

(58) Field of Classification Search ............ 365/193, 365/194, 189.14

See application file for complete search history.

(56) References Cited

U.S. PATENT DOCUMENTS 7,180,800 B2 * 2/2007 Kim .......................... 365/193

FOREIGN PATENT DOCUMENTS

| JP | 2007-058990 A | 3/2007 |
|---|---|---|
| JP | 2008-052335 A | 3/2008 |

* cited by examiner

*Primary Examiner* — Son Dinh
*Assistant Examiner* — Nam Nguyen
(74) *Attorney, Agent, or Firm* — Sughrue Mion, PLLC

(57) ABSTRACT

A memory interface includes a first delaying circuit configured to delay write data to be supplied to an input buffer; a second delaying circuit configured to delay read data read out from an output buffer; a data write circuit configured to supply said write data to a memory through said first delaying circuit; and a data read circuit configured to read said write data written in said memory, as said read data through said second delaying circuit. A control circuit is configured to detect positions of a start edge and end edge of an eye opening which is formed based on fluctuation of said write data or said read data, to specify an intermediate position of the start edge and the end edge, and to determine a phase of a data strobe signal based on a difference between the intermediate position and one of the start edge and the end edge.

3 Claims, 11 Drawing Sheets
(2 of 11 Drawing Sheet(s) Filed in Color)

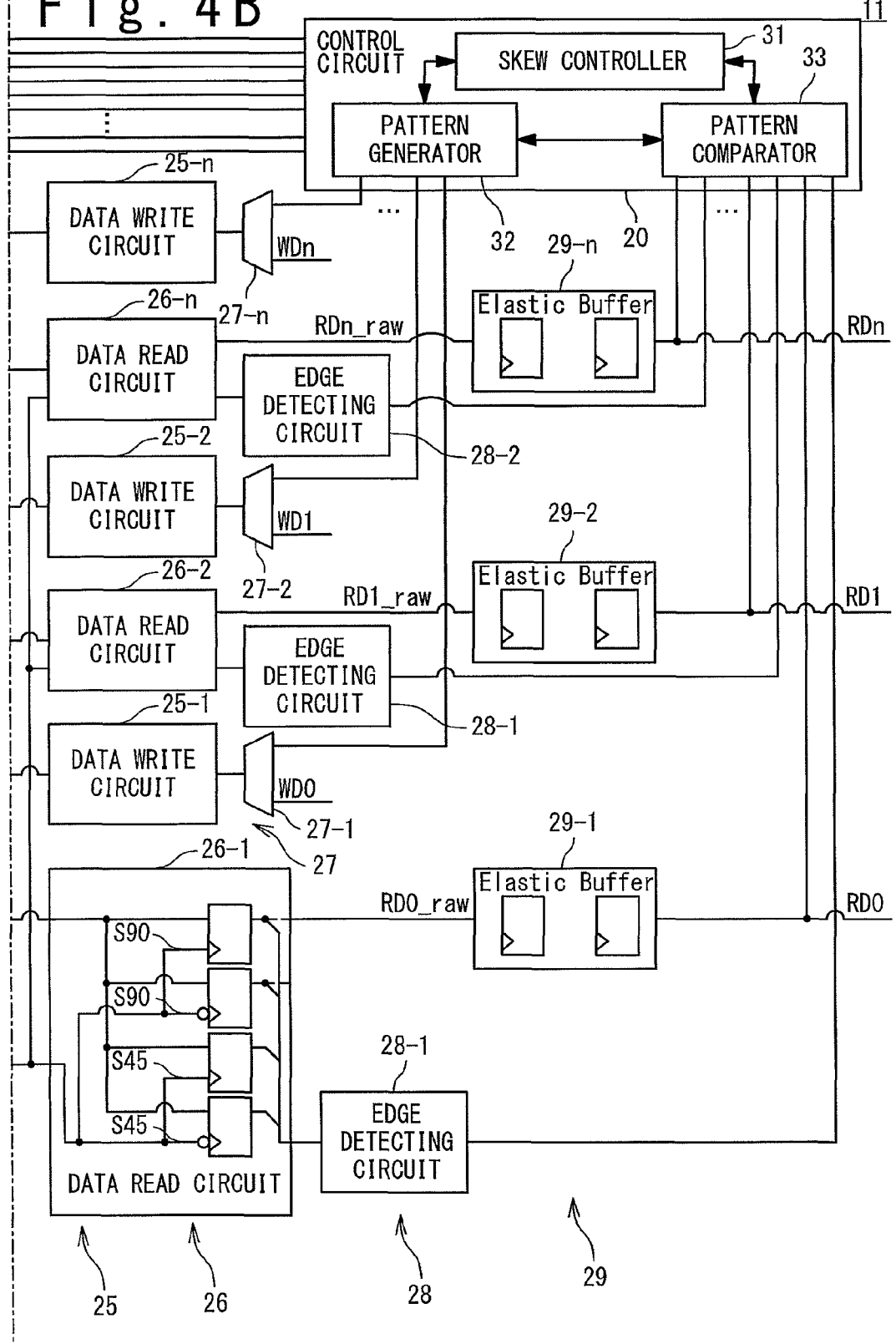

MEMORY INTERFACE AND OPERATION METHOD OF IT

INCORPORATION BY REFERENCE

This patent application claims a priority on convention based on Japanese Patent Application No. 2008-253989. The disclosure thereof is incorporated herein by reference.

BACKGROUND OF THE INVENTION

1. Field of the Invention

The present invention relates to a memory interface and an operation method of the memory interface.

2. Description of Related Art

With advancement of information processing technique, a semiconductor memory device is possible to perform a high speed operation with less consumed power. As such a semiconductor memory device, a technique is known which uses a data strobe signal (DQS). The semiconductor memory devices are exemplified by semiconductor storage devices having a data transfer rate in a Gbps order such as DDR2 (Double Data Rate 2) SDRAM (Synchronous DRAM) and DDR3 SDRAM.

Generally, a memory interface is interposed between a high-speed semiconductor memory device and a central processing unit (CPU). The commercially available semiconductor storage devices such as DDR2 SDRAM and DDR3 SDRAM have unstable logical states of internal circuits immediately after power-on. In the semiconductor memory devices, initialization by the memory interface is performed immediately after power-on in order to ensure a normal operation.

FIG. 1 is a flow chart showing an initializing operation of a conventional semiconductor memory device. Referring to FIG. 1, at Step S1, an I/O and a memory are enabled and initial values thereof are set. After that, at Step S2, timing calibration is carried out. Then, at Step S3, an initialization sequence is ended and start of a normal operation is prepared.

FIGS. 2A to 2C are block diagrams showing configurations and an operation of the above-mentioned timing calibration. The timing calibration is performed based on control both on a memory side and an interface side. FIG. 2A is a diagram showing a first phase of timing calibration. FIG. 2B is a diagram showing a second phase of timing calibration. FIG. 2C is a diagram showing a third phase of timing calibration. Referring to FIG. 2A, in the first phase of the timing calibration, a transfer rate is decreased and data for read calibration (for example, PRBS 27-1) is written. Referring to FIG. 2B, in the second phase, skew adjustment of DQ and DQS on a read side is performed using the written data. Referring to FIG. 2C, in the third phase, the skew adjustment of DQ and DQS on write side is performed.

In a conventional skew adjustment, when physical limitations (for example, limitations that can be adjusted by a designer, such as variations in relative accuracy and substrate wiring) cannot be suppressed on the write side, a mode is changed to an SDR mode or the transfer rate is decreased to reliably write data. The method requires a function to safely switch a frequency dividing ratio and a mode of a clock in a normal mode "on the fly" and a test circuit. A test requires a pseudo random pattern such as PRBS (pseudo random bit sequence). For example, when the above-mentioned timing calibration is performed using a particular pattern length such as PRBS7 stages, the following three processes:

"Write of Read data",
"Calibration of Read", and
"Calibration of Write"
must be performed.

When data cannot be correctly read in read, it is difficult to determine whether it is caused due to failure of initial write or a problem in the read. When the initial write fails, the write needs to be performed again by decreasing the frequency.

In addition to the above-mentioned technique, another technique of a memory interface circuit has been known. Japanese Patent Application Publication (JP-P2007-058990A: first conventional example) describes a method of allowing a loopback test in an interface in which phase relationship between data and a strobe signal for sampling the data varies between an input and an output. Referring to the first conventional example, to test phase shift on an input side and a sampling circuit, DQ and DQS are outputted in the same phase in a phase shift circuit on an output side and DQS is shifted by the phase shift circuit by 90 degrees and sampled by the sampling circuit. To test a function on the output side, the phase shift circuit is controlled so as not to shift the phase of DQS on the input side. The phase shift circuit on the output side sets phase shift of the data sampling clock to 90 degrees and fixes phase shift of DQS to 180 degrees. The sampling circuit samples the loop-backed DQ based on DQS phase-shifted by 90 degrees.

Japanese Patent Application Publication (JP-P2008-052335A: second conventional example) describes another technique related to an interface circuit having a calibration circuit for automatically detecting a data effective window of a data signal and adjusting an optimum delay amount of a strobe signal and a data signal delay circuit. Given that a minimum delay amount in the calibration circuit is $t_{MINDLY}$, a skew between the data signal and the strobe signal is $t_{SKEW}$, and a set-up time of the data signal is $t_{SETUP}$, the data signal delay circuit delays the data signal by a delay amount $t_{FIXDLY}$ which satisfy $t_{FIXDLY} > t_{MINDLY} + t_{SKEW} - t_{SETUP}$.

As described above, when the timing calibration is performed, when first write cannot be reliably performed, the conventional memory interface cannot read normal data in read. For this reason, in the conventional memory interface, when data cannot be completely read in the read, it is difficult to determine whether the failure is due to failure of the first write, failure of fetching of data or a problem in the read in spite of success of the first write. Especially, in a semiconductor memory device which transmits data at high speed, a rate of jitter due to reflection in 1-bit length, ISI (inter stimulus interval), IR drop and the like has increased because of speeding up and miniaturization in process. Thus, for a memory interface for such a semiconductor memory device, there is a demand for a technique capable of stably reading and writing data even when the rate of jitter is large.

SUMMARY OF THE INVENTION

In an aspect of the present invention, a memory interface includes a first delaying circuit configured to delay write data to be supplied to an input buffer; a second delaying circuit configured to delay read data read out from an output buffer; a data write circuit configured to supply the write data to a memory through the first delaying circuit; a data read circuit configured to read the write data written in the memory, as the read data through the second delaying circuit; an edge detecting circuit configured to detect edges of the read data; and a control circuit configured to detect positions of a start edge and an end edge of an eye opening which is formed based on fluctuation of the write data or the read data, to specify an intermediate position of the start edge and the end edge, and to determine a phase of a data strobe signal based on a difference between the intermediate position and one of the start edge and the end edge. The data write circuit writes first test data in which at least two bits with a same sign succeed, in the memory in a normal mode, and the data read circuit reads the written first test data from the memory. The edge detecting circuit detects a transition timing at which the level of the read first test data transits and notifies the transition timing to the control circuit, and the control circuit specifies a timing of the start edge of the eye opening based on the transition timing. The data write circuit writes a second test data which contains only a single 1-bit lone pulse, in the memory in the normal mode, and the data read circuit reads the written second test data from the memory. The control circuit detects whether or not the read second test data is coincident with an expectation of read data which is formed based on the position of the start edge of the eye opening, and detects the position of an end edge based on the expectation.

The control circuit sets delay values of the first delaying circuit and the second delaying circuit to a minimum value, and instructs the data write circuit to write the first test data, and the data read circuit performs the read in response to a first data strobe signal and a second data strobe signal different in phase from the first data strobe signal. The edge detecting circuit detects the transition timing based on the levels of two of first test data respectively latched in response to the first and second data strobe signals.

In another aspect of the present invention, an operation method of a memory interface is achieved by detecting a position of a first edge in an eye opening formed based on fluctuation of data; by detecting a position of a second edge opposing to the first edge; and by setting an intermediate position between the first edge and the second edge to a falling/rising position of a data strobe signal. The detecting a position of a first edge is achieved by writing a first test data in which at least two bits with a same sign succeed, in a memory in a normal mode; by reading the written first test data from the memory; by detecting a transition timing at which a level of the read first test data transits; and by specifying a timing of the first edge of the eye opening based on the transition timing. The detecting a position of a second edge is achieved by writing a second test data which contains only a single 1-bit lone pulse, in the memory in the normal mode; by reading the written second test data from the memory; by detecting whether or not the read second test data is coincident with an expectation area of data read/write expected based on the timing of the first edge of the eye opening; and by detecting the position of the second edge based on the expectation area.

According to the present invention, in a memory system for reading and writing data by using a data strobe signal, a technique of properly performing timing calibration in an initialization sequence can be provided.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and other objects, advantages and features of the present invention will be more apparent from the following description of certain embodiments taken in conjunction with the accompanying drawings, in which:

FIGS. 4A and 4B are a block diagram showing a configuration of the memory interface;

DESCRIPTION OF PREFERRED EMBODIMENTS

Figure 1:
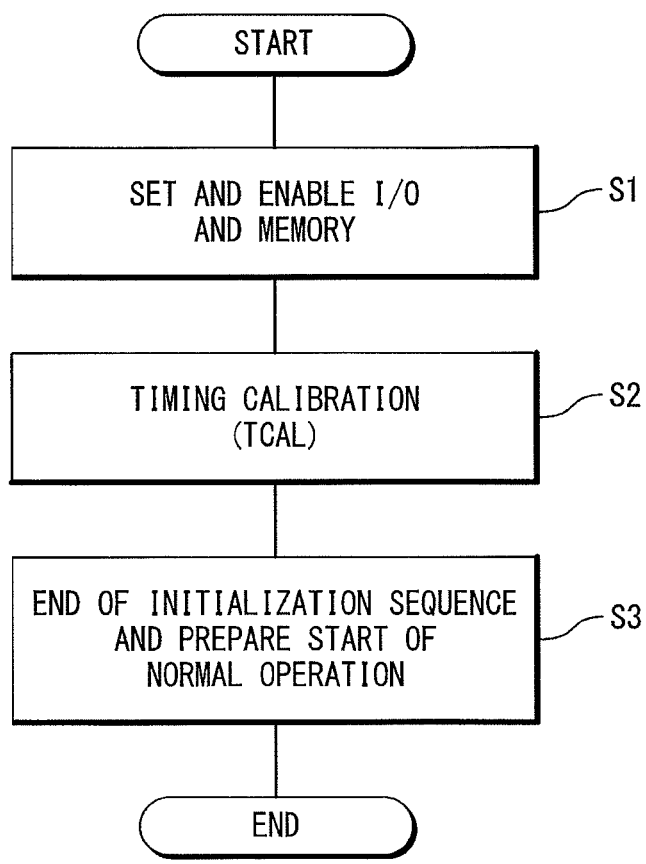
FIG. 1 is a flow chart showing an initializing operation of a conventional semiconductor memory device.
Figure 2A:
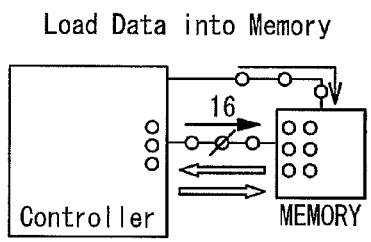
FIGS. 2A to 2C are block diagrams showing configurations and an operation of timing calibration.
Figure 2B:
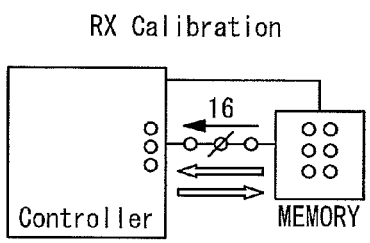
Figure 2C:
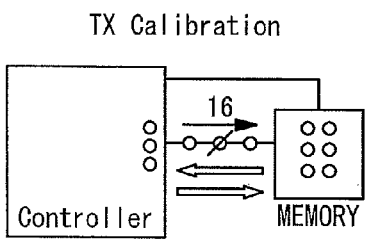

Hereinafter, a memory interface 11 according to the present invention will be described with reference to the attached drawings. The memory interface 11 according to an embodiment of the present invention controls read/write of data from/to a semiconductor memory device in response to a data strobe signal. The memory interface 11 in the present embodiment can be applied to any equipment without limitation, and the semiconductor memory device mounted in the equipment may respond to the data strobe signal. Accordingly, a configuration and an operation of the present embodiment will be described below using a case where the memory interface 11 is mounted in a computer system 1 as an example. In the drawings for showing the configuration and the operation of the present embodiment, the same reference numerals are assigned to the same components.

Figure 3:
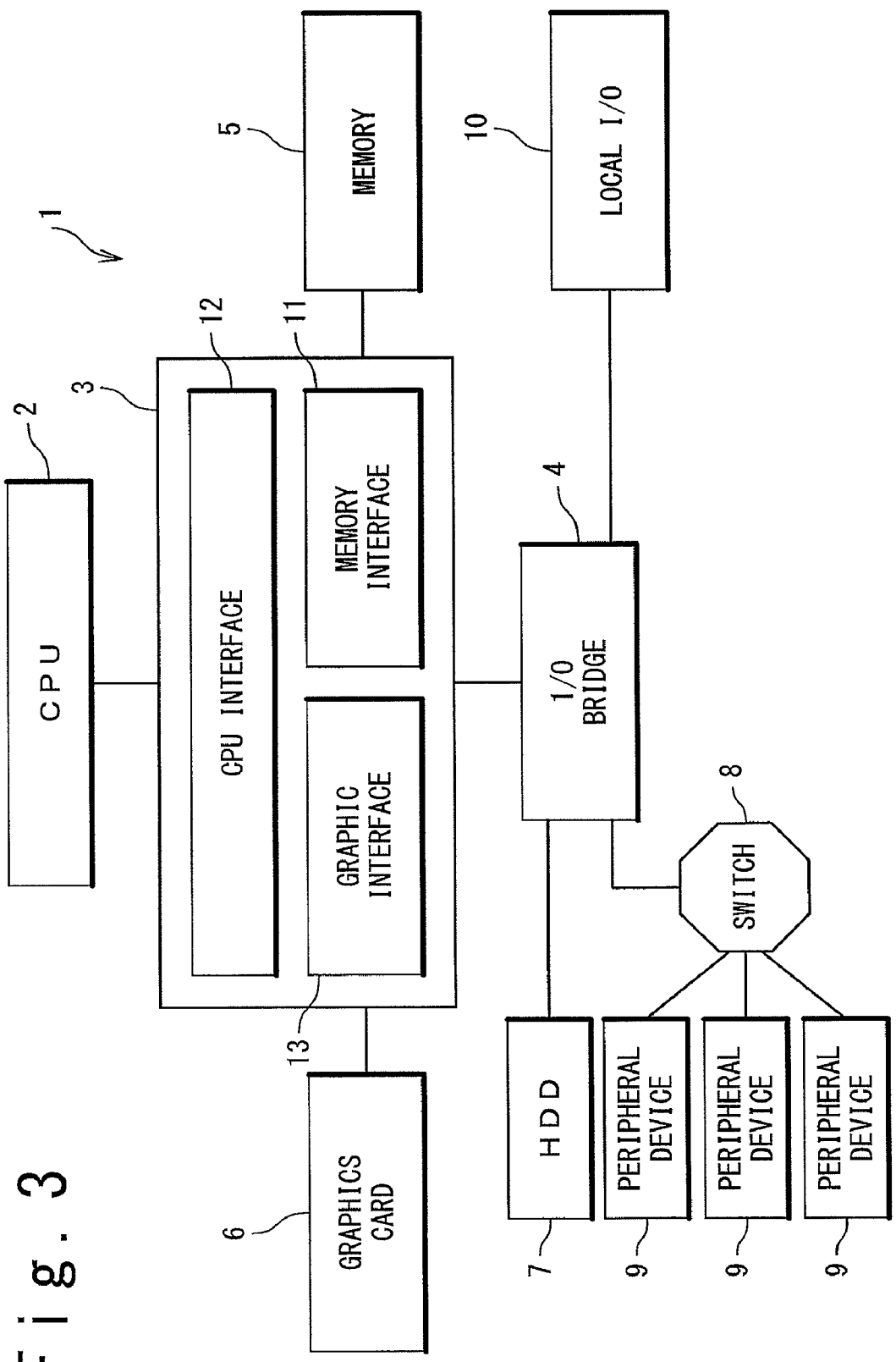
FIG. 3 is a block diagram showing a configuration of a computer system mounted with a memory interface according to an embodiment of the present invention.

FIG. 3 is a block diagram showing a configuration of the computer system 1 mounted with the memory interface 11 in the present embodiment. The computer system 1 is a type of information processing apparatus supporting a chip set including the memory interface 11 and can perform functions such as inputting, outputting, storage, calculation and control. The computer system 1 includes a CPU (Central Processing Unit) 2, a memory bridge 3, an I/O bridge 4, a memory 5, a graphics card 6, an HDD 7, a switch 8, peripheral devices 9 and a local I/O 10.

The CPU 2 is a central processing unit provided in a main body of the information processing apparatus as the computer system 1 in the present embodiment. The CPU 2 controls various units provided for the computer system 1 and processes data. The CPU 2 interprets and calculates data received from an input unit (not shown) and outputs the calculation result to an output unit (not shown). The memory bridge 3 is sometimes referred to as a north bridge and interconnects the CPU 2 and the memory 5 for bridge of data. The memory bridge 3 also interconnects the CPU 2 and an extension bus for bridge of data. The I/O bridge 4 is sometimes referred to as a south bridge, integrates various I/O controllers and bridges data with the extension bus or the like.

The memory 5 is referred to as a main memory and stores data and programs. The memory 5 has a region where the CPU can directly read and write. A following embodiment shows a case where the memory 5 is a high-speed semiconductor memory device such as the DDR3 SDRAM as an example. The graphics card 6 is a circuit board for displaying data on an output device (for example, a liquid crystal display) of the computer system 1. The graphics card 6 is connected to the CPU 2 through the memory bridge 3 and provides the data display to the user in response to a command of the CPU 2. The HDD 7 is an auxiliary memory device which can hold information even after power-off. In the computer system 1 in the present embodiment, in addition to the HDD 7, a nonvolatile semiconductor memory device such as a flash memory may be used as an auxiliary memory device. The peripheral devices 9 are external input/output devices connected to the I/O bridge 4 through the switch 8. The local I/O 10 is a peripheral device inherent to the computer system 1.

As shown in FIG. 3, the memory bridge 3 includes the memory interface 11, a CPU interface 12 and a graphics interface 13. The memory interface 11 is connected to the memory 5 and controls data write data to the memory 5 and data read from the memory 5. The CPU interface 12 is connected to the CPU 2, receives a command from the CPU 2 and supplies data to the CPU 2. The graphics interface 13 is connected to the graphics card 6 and controls supply of image data to the graphics card 6.

Figure 4A:
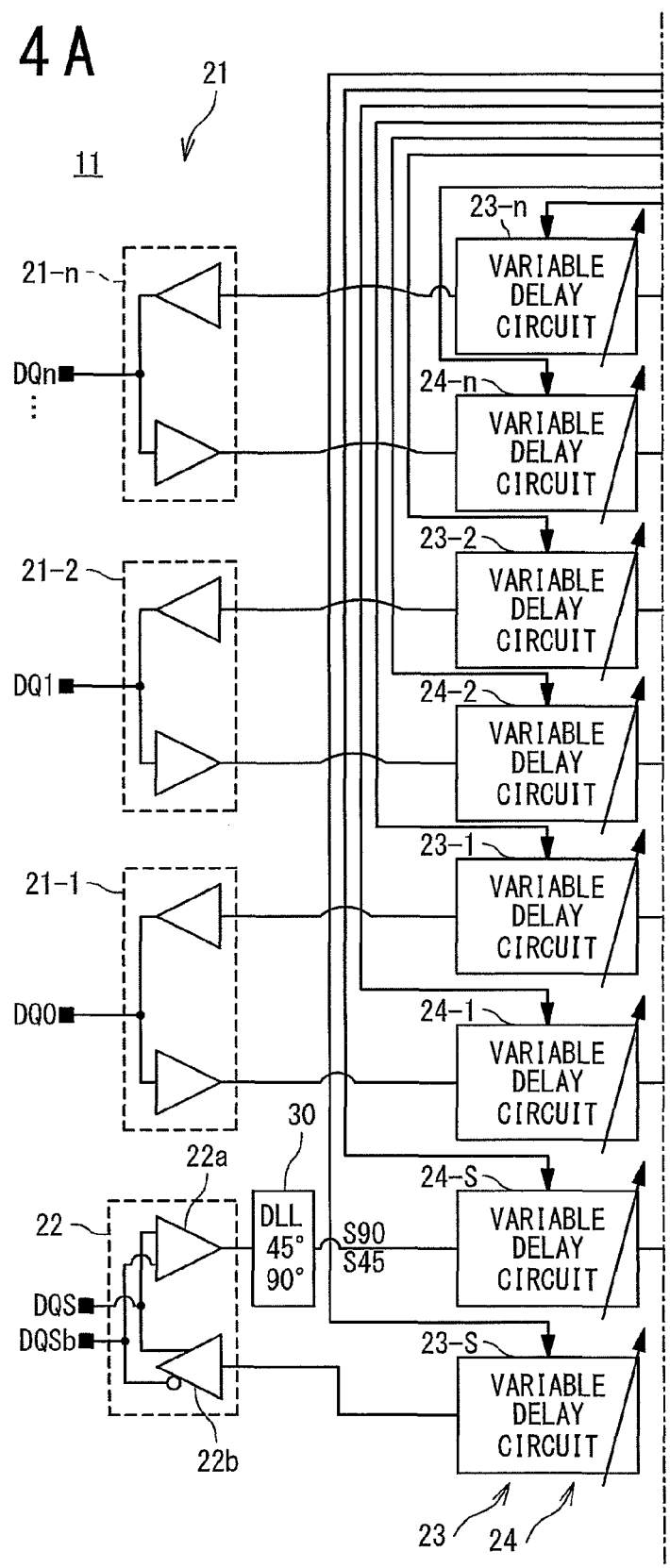

A detailed configuration of the memory interface 11 will be described below. FIGS. 4A and 4B are block diagrams showing a configuration of the memory interface 11. FIG. 4A shows a first region of the memory interface 11. FIG. 4B shows a second region of the memory interface 11. Referring to FIGS. 4A and 4B, the memory interface 11 includes a control circuit 20, input/output buffers 21, a data strobe input/output buffer 22, write-side delay circuits 23, read-side delay circuits 24, data write circuits 25, data read circuits 26, selectors 27, edge detecting circuits 28, elastic buffers 29 and a DLL (Delay Lock Loop) 30. In the following description, when a plurality of components having the same function need to be distinguished from each other another, branch numbers are added to respective reference numerals.

The input/output buffers 21 temporarily store data to be written to the memory and data read out from the memory. The memory interface 11 includes the input/output buffers 21 such as a first input/output buffer 21-1, a second input/output buffer 21-2 . . . an $n^{th}$ input/output buffer 21-n. Each of the input/output buffers 21 has a write buffer and a read buffer. The data strobe input/output buffer 22 temporarily holds a data strobe signal DQS (an inverted data strobe signal DQSb). The data strobe input/output buffer 22 includes a data strobe read buffer 22a and a data strobe write buffer 22b.

The control circuit 20 is provided in the memory interface 11 and controls values to be set for each of circuits in the memory interface 11 and data write/read timing.

The write-side delay circuit 23 delays a data to be written to the memory. The memory interface 11 includes the write-side delay circuits 23 such as a first write-side delay circuit 23-1, a second write-side delay circuit 23-2, . . . an $n^{th}$ write-side delay circuit 23-n. Each of the write-side delay circuits 23 is connected to a write buffer of the corresponding one of the input/output buffers 21. The write-side delay circuits 23 can vary a delay time in response to a delay control signal supplied from the control circuit 20. The memory interface 11 also includes a write-side data strobe delay circuit 23-S. The write-side data strobe delay circuit 23-S is connected to the data strobe write buffer 22b.

The read-side delay circuit 24 delays a data to be read out from the memory. The memory interface 11 includes the read-side delay circuits 24 such as a first read-side delay circuit 24-1, a second read-side delay circuit 24-2, . . . an $n^{th}$ read-side delay circuit 24-n. Each of the read-side delay circuits 24 is connected to the read buffer of a corresponding one of the input/output buffers 21. The read-side delay circuit 24 can vary a delay time in response to the delay control signal supplied from the control circuit 20. The memory interface 11 also includes a read-side data strobe delay circuit 24-S. The read-side data strobe delay circuit 24-s is connected to the data strobe read buffer 22a through the DLL circuit 30.

In an initialized state, The DLL 30 generates two types of data strobe signals with different phases (hereinafter to be referred to as a first data strobe signal S90 and a second data strobe signal S45) in response to the data strobe signal DQS supplied from the data strobe read buffer 22a.

The data write circuits 25 supply the write data to be written into the memory. The memory interface 11 includes the data write circuits 25 such as a first data write circuit 25-1, a second data write circuit 25-2, . . . a $n^{th}$ data write circuits 25-n.

The data write circuits 25 are connected to the corresponding write-side delay circuits 23, respectively. The data write circuits 25 converts parallel data into serial data.

The data read circuits 26 output the read data read out from the memory to subsequent stages. The memory interface 11 includes the data read circuits 26 such as a first data read circuit 26-1, a second data read circuit 26-2, . . . an $n^{th}$ data read circuit 26-n. The data read circuits 26 are connected to the corresponding read-side delay circuits 24, respectively. Each of the data read circuits 26 reads data in response to the data strobe signals DQS (a first data strobe signal S90, a second data strobe signal S45) supplied from the read-side data strobe delay circuit 24-S. The data read circuits 26 also convert serial data into parallel data.

The selectors 27 select a test pattern supplied from the control circuit 20 during initialization and write data in a normal operation. The memory interface 11 includes the selectors 27 such as a first selector 27-1, a second selector 27-2, . . . an $n^{th}$ selector 27-n. The selectors 27 are connected to the data write circuits 25, respectively.

Based on data supplied from the data read circuits 26, the edge detecting circuits 28 detect an edge of the data. The memory interface 11 includes the edge detecting circuits 28 such as a first edge detecting circuit 28-1, a second edge detecting circuit 28-2, . . . an $n^{th}$ edge detecting circuit 28-n. Each of the plurality of edge detecting circuits supplies the detection result to the control circuit 20.

The elastic buffers 29 temporarily hold the data supplied from the data read circuits 26 and then, supply the data to a circuit in the subsequent stage (for example, CPU). The memory interface 11 includes the elastic buffers 29 such as an elastic buffer 29-1, an elastic buffer 29-2, . . . an elastic buffer 29-n. The elastic buffers 29 are provided for the data read circuits 26, respectively.

Referring to FIG. 4B, the control circuit 20 has a skew controller 31, a pattern generator 32 and a pattern comparator 33. The skew controller 31 controls phase of data DQ and the data strobe signal DQS. The pattern generator 32 generates a pattern written to the memory 5. The pattern comparator 33 compares a read data pattern with the written data pattern.

Figure 5:
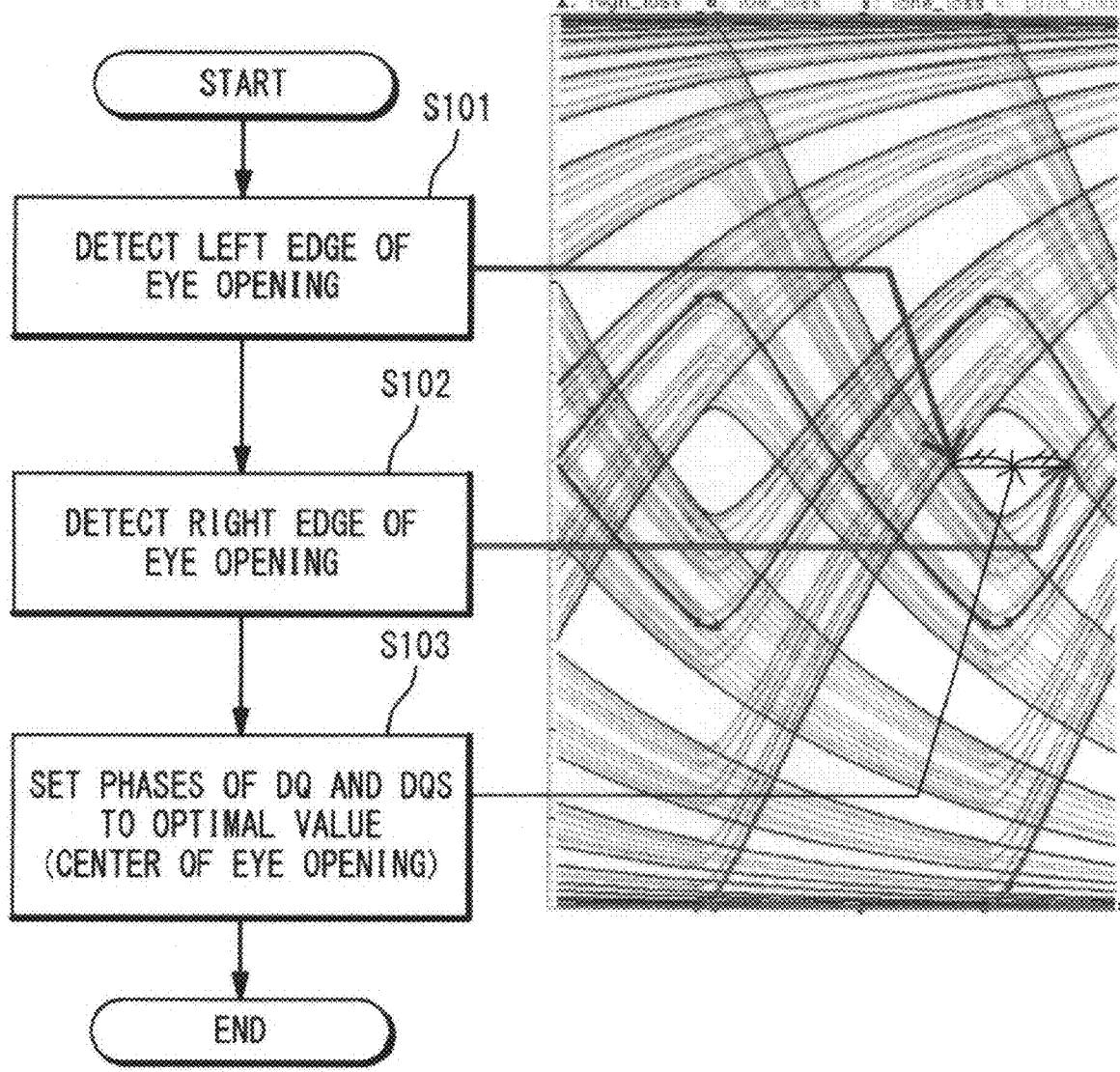
FIG. 5 is a flow chart showing an operation in the present embodiment.

An operation in the present embodiment will be described below. FIG. 5 is a flow chart showing the operation of the present embodiment. During execution of an initialization operation, the memory interface 11 in the present embodiment performs a calibration operation according to a procedure shown in FIG. 5.

Referring to FIG. 5, at Step S101, the memory interface 11 identifies timing of one edge (left edge) at the time when an eye opening (timing margin) is formed. As shown in FIG. 5, the memory interface 11 sets the time when the eye opening appears in time flow to the timing of the edge. At Step S102, the memory interface 11 identifies timing of the other edge (right edge) of the eye opening. As shown in FIG. 5, the memory interface 11 sets the time when the eye opening disappears in time flow to timing of the edge.

Subsequently, at Step S103, the memory interface 11 sets operational timing of the data strobe signal DQS on the basis of the identified timings of the two edges. In this manner, the phases of the data DQ and the data strobe signal DQS are optimized at initialization. The above-mentioned flow chart shows a case where a left edge of the eye opening is first identified. The operation of the memory interface 11 in the present embodiment is not limited to the operation in this flow chart and a right edge of the Eye opening may be first identified.

Figure 6:
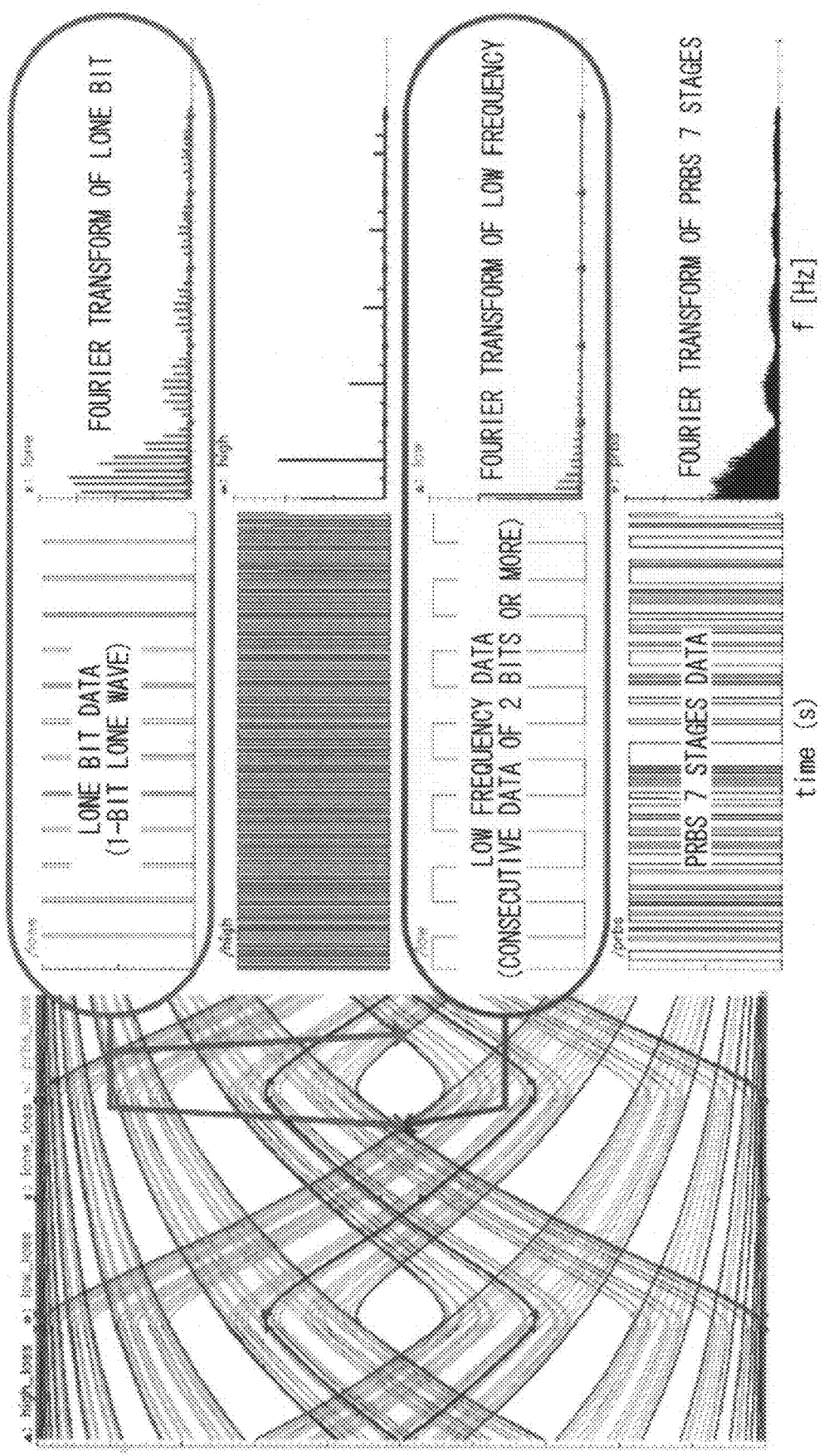
FIG. 6 is a diagram showing a waveform of data used in a calibration operation by the memory interface in the embodiment.

Here, the operation in the present embodiment will be described in detail. FIG. 6 is a diagram showing a waveform of data used in a calibration operation by the memory interface 11 in the present embodiment. In the present embodiment, data of a lone bit (1-bit solitary wave) and data of low frequency (data in which at least two bits with a same sign succeed) are used in an initialization sequence.

As shown in FIG. 6, a frequency component of the data of low frequency leans to a low frequency range and the left edge of the eye opening can be detected according to the pattern, while avoiding jitter. The data of a single lone bit is a solitary wave (for example, 01000000) where only 1 bit has a different logic value and its frequency components have data components over a high frequency range as in PRBS. For this reason, it is easily affected by data quality deterioration that high-frequency data is attenuated due to loss of a transmission line. Thereby, the right edge and the left edge of the eye opening can be detected.

Figure 7:
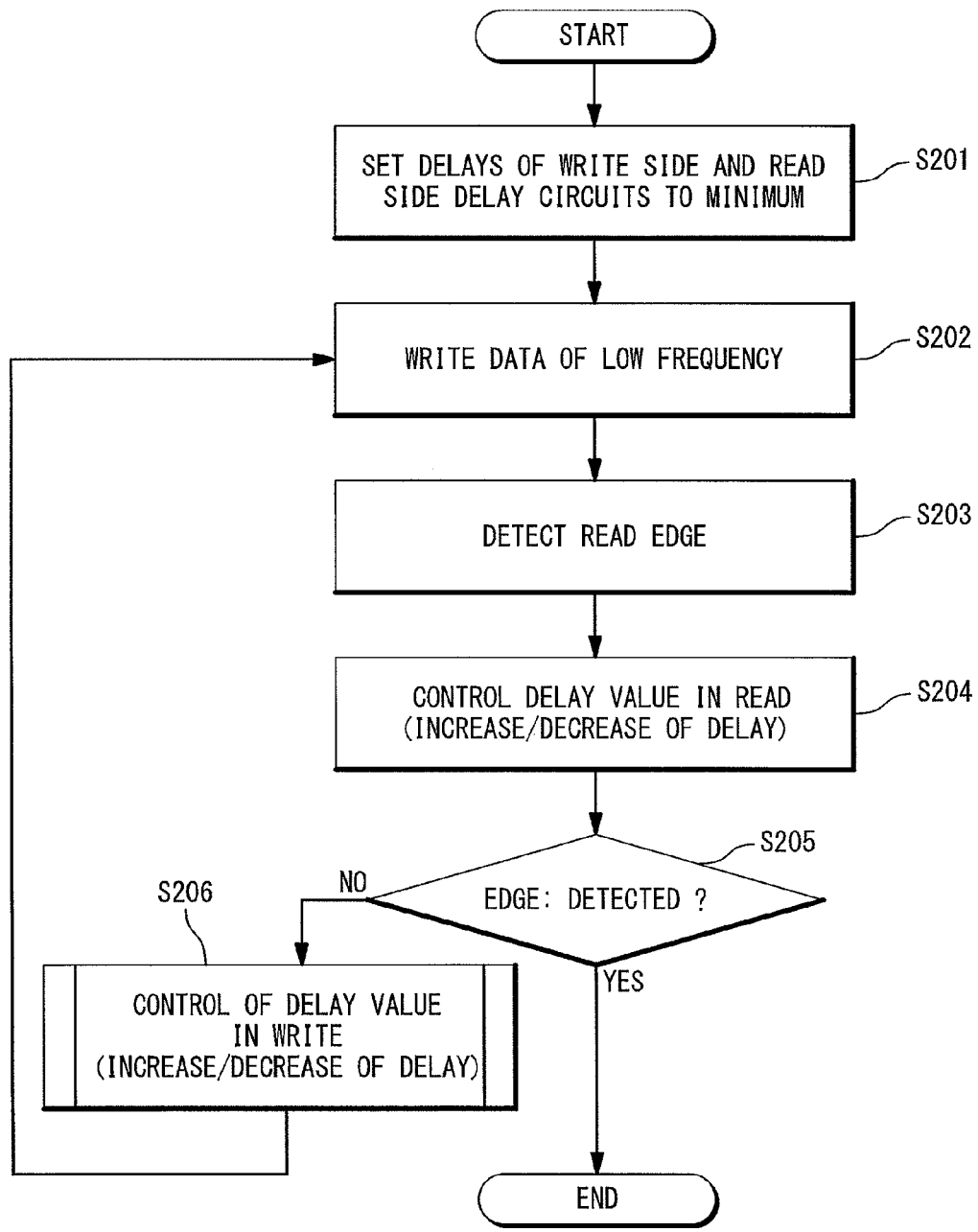
FIG. 7 is a flow chart showing the calibration operation in the embodiment in detail.

FIG. 7 is a flow chart showing the operation at the Step S101 in FIG. 5 in detail. By the operation shown in FIG. 7, the memory interface 11 detects the left edge of the eye opening. While writing and reading of data of low frequency, the memory interface 11 finds a region where a random jitter can be avoided, that is, a region from RL0 to RR1 in FIG. 10, in case of read. The left edge of the eye opening corresponds to RL0. The memory interface 11 also finds a region where data can be written, that is, a region from WL0 to WR0 in FIG. 10, in case of write.

Referring to FIG. 7, at Step S201, the skew controller 31 provided in the control circuit 20 of the memory interface 11 sets delays of the write-side delay circuits 23 and the read-side delay circuits 24 to a minimum value. At Step S202, the control circuit 20 writes the data of low frequency into the memory 5 through the write-side delay circuits 23 in a normal mode.

At Step S203, the control circuit 20 instructs the read-side delay circuits 24 to read the data of low frequency. In response to the instruction, the read-side delay circuits 24 reads the data of low frequency from the memory 5. In response to the read operation, an edge detecting sequence is performed.

At Step S204, the edge detecting circuits 28 detect the edges on the basis of the data of low frequency supplied from the read-side delay circuits 24. The edge detecting circuits 28 notify the detection results to the control circuit 20.

At Step S205, based on the notices from the edge detecting circuits 28, the control circuit 20 determines whether or not the edges are detected. In a case where the edges are detected as a result of the determination, a control flow is ended. In a case where it is determined that the edges are not detected as a result of the determination, the control flow proceeds to Step S206. At Step S206, the control circuit 20 varies a delay amount of the write-side delay circuits 23. Then, the control flow returns to Step S202 and the data of low frequency is written into the memory 5 through the write-side delay circuits 23.

Figure 8:
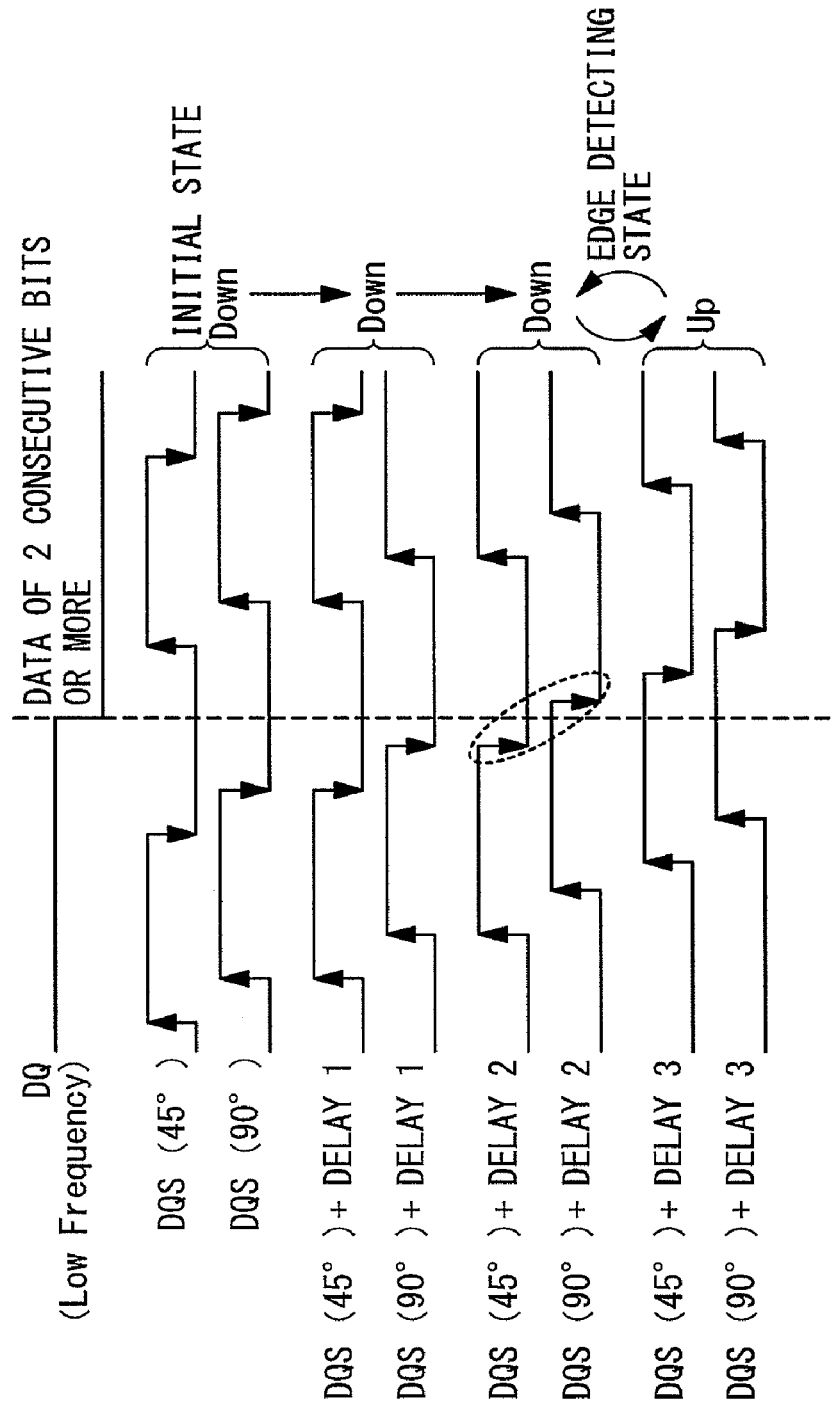
FIG. 8 shows timing charts in an edge detecting operation.

FIG. 8 shows timing charts of the above-mentioned edge detecting operation. As shown in FIG. 8, the memory interface 11 latches the same data at a plurality of clocks of different phases (here, 45 degrees and 90 degrees), as used in S-ATA (Serial-Advanced Technology Attachment) and detects the phase or edge by comparing the phases with each other. At this time, it is sufficient to detect the edge and thus, a fact that the data of low frequency has been normally written is not necessary. For example, even when it is attempted to write "11001100" but "11100100" is wrongly written due to a shift of the data strobe signal DQS, there exist at least three edge change points. Therefore, the edge detection is possible.

Figure 9:
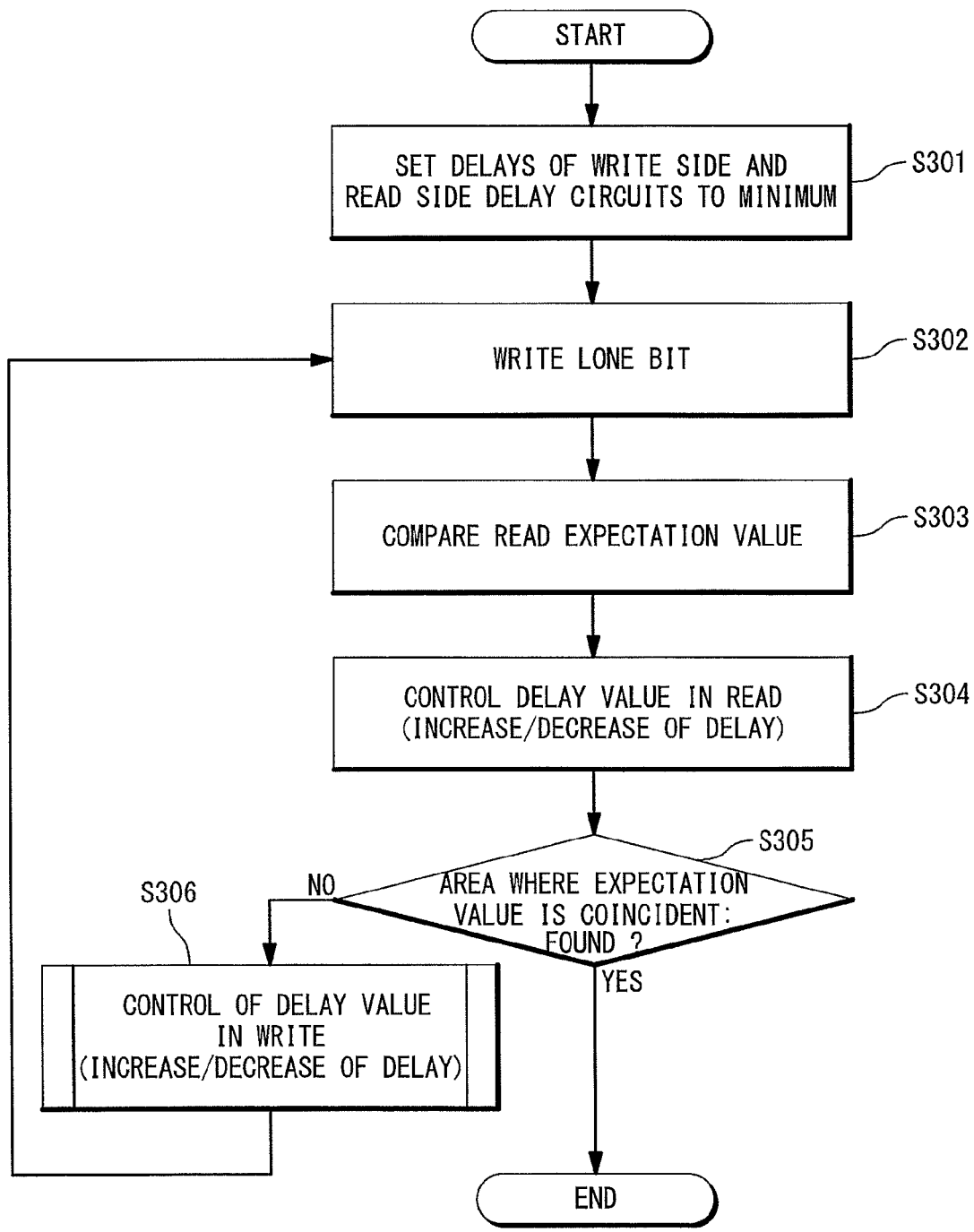
FIG. 9 is a flow chart showing the calibration operation in the embodiment in detail.

FIG. 9 is a flow chart showing the operation at Step S102 in FIG. 5 in detail. By the operation shown in FIG. 9, the memory interface 11 detects the right edge of the eye opening. Using the lone bit pattern, the memory interface 11 detects a region where data can be normally read/written and deterioration due to ISI (inter-symbol interface) is taken into account, that is, a region from RL0 to RR1' and a region from WL0' to WR0' in FIG. 10. Here, the right edge of the eye opening corresponds to RR1'.

Figure 10:
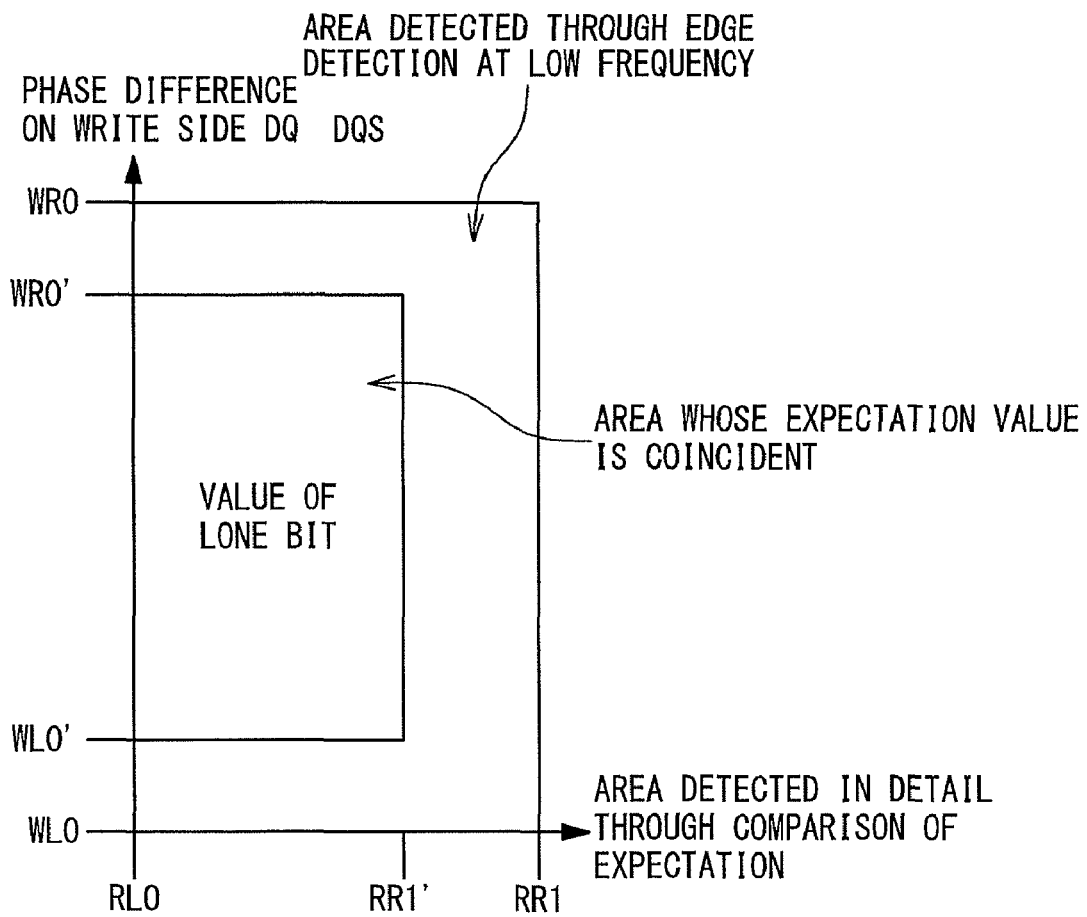
FIG. 10 is a conceptual diagram showing a configuration of a region used for comparison of an expectation value in an operation of detecting a right end of an eye opening.

FIG. 10 is a conceptual diagram showing a configuration of a region used for comparison of an expectation value in the operation of detecting the right edge of the eye opening. FIG. 10 shows a region detected by edge detection in low frequency and a region detected in detail according to expectation value comparison of lone bit.

The region detected by the edge detection in low frequency is determined depending on identification of the left edge of the eye opening in case of read of the data of the low frequency and identification of the region where data can be written in case of write. The region detected in detail according to the expectation value comparison of lone bit is determined depending on identification of the right edge of the eye opening in case of the read of the data of the lone bit and identification of the right edge and the left edge of the eye opening in case of the write.

As shown in FIG. 10, a position of the left side of the eye opening is recognized in case of the read. For this reason, when no shift for 1 UI (Unit Interval) exists, read of data never fails. It means existence of a shift for 1 UI or more that the written data cannot be properly read during detection of the region corresponding to the expectation value.

Returning to FIG. 9, at Step S301, the control circuit 20 of the memory interface 11 sets delays of the write-side delay circuits 23 and the read-side delay circuits 24 to a minimum value. At Step S302, the control circuit 20 writes the data of lone bit into the memory 5 through the write-side delay circuits 23 in the normal mode.

At Step S303, the memory interface 11 reads the data of lone bit. In response to the read operation, an expectation value comparison sequence is performed. At Step S304, a delay position of the data of lone bit supplied from the read-side delay circuits 24 is controlled.

At Step S305, the control circuit 20 determines whether or not a region corresponding to the expectation value is detected. For the expectation value comparison of the data, parallel data after conversion is used. For this reason, since detection of the edge is ended even in the case where the bit shift in the control flow (that is, there is shift of 1 UI), correction can be made based on the detected edge. When it is determined that the region is detected, the control flow is ended. When it is determined that the region is not detected, the control flow proceeds to Step S306.

At Step S306, when the written data cannot be properly read during the detection of the region corresponding to the expectation value, the phase is shifted by 1 UI and the detection of the region is started again.

The memory interface 11 in the present embodiment does not require a function to safely switch a frequency dividing ratio and a mode of a clock in the normal mode "on the fly" nor a test circuit. Even if the memory interface 11 cannot perform normal write, data is written in spite of omission of data, when the data of low frequency is written. In the edge detecting sequence using the data of low frequency, when the data is read, only the edge of the data is detected. Since a skew is detected without depending on the expectation value comparison of the data in the sequence, the left side of the eye opening can be detected in the read. In addition, even when write fails, the eye opening can be checked through the edge detection in the expectation value comparison (calibration of read) sequence. Thereby, the number of tests can be reduced to twice ("Calibration of Read" and "Calibration of Write").

Furthermore, since the computer system 1 in the present embodiment needs to detect only the right and left edges of the eye opening, a pattern length may be small. In other words, a memory space for write the PRBS pattern (the number of patterns=127) required for read calibration is unnecessary. For this reason, a memory space for storing test data in calibration at initialization can be reduced.

The embodiment of the present invention has been specifically described. Although a DDR interface can perform high-speed communication in a Gbps band, a transmission mode thereof is CMOS (voltage). Thus, deterioration of a data quality caused by reflection and ISI is large and the deterioration amount occupies a half of 1-bit length of data or greater. In addition, with miniaturization in the process, a delay difference between data bits due to variations in a relative accuracy of transistors in the interface has become considerable large. Furthermore, a wire length/form on the substrate needs to be arbitrarily set for multiple uses and response time (Flight Time) needs to cover 1-bit length or more.

According to the present invention, a circuit capable of reliably reading/writing data in case of deterioration in data quality is integrated into an interface side. When there is a difference (skew) in the delay amounts of the data strobe signal DQS and the data DQ at write/read, the memory interface 11 in the present embodiment can find an optimum value in a short time at read/write by controlling and performing a test flow on the interface side.

The present invention is not limited to the above-mentioned embodiment and may be variously modified so as not to deviate from the subject matter of the present invention.

What is claimed is:

1. A memory interface comprising:
    a first delaying circuit configured to delay write data to be supplied to an input buffer;
    a second delaying circuit configured to delay read data read out from an output buffer;
    a data write circuit configured to supply said write data to a memory through said first delaying circuit;
    a data read circuit configured to read said write data written in said memory, as said read data through said second delaying circuit;
    an edge detecting circuit configured to detect edges of said read data; and
    a control circuit configured to detect positions of a start edge and an end edge of an eye opening which is formed based on fluctuation of said write data or said read data, to specify an intermediate position of the start edge and the end edge, and to determine a phase of a data strobe signal based on a difference between the intermediate position and one of the start edge and the end edge,
    wherein said data write circuit writes first test data in which at least two bits with a same sign succeed, in said memory in a normal mode,
    said data read circuit reads the written first test data from said memory,
    said edge detecting circuit detects a transition timing at which the level of the read first test data transits and notifies the transition timing to said control circuit, and
    said control circuit specifies a timing of the start edge of said eye opening based on the transition timing,
    wherein said data write circuit writes a second test data which contains only a single 1-bit lone pulse, in said memory in the normal mode,
    said data read circuit reads the written second test data from said memory, and
    said control circuit detects whether or not the read second test data is coincident with an expectation of read data which is formed based on the position of the start edge of said eye opening, and detects the position of an end edge based on said expectation.

2. The memory interface according to claim 1, wherein said control circuit sets delay values of said first delaying circuit and said second delaying circuit to a minimum value, and instructs said data write circuit to write the first test data,
    said data read circuit performs the read in response to a first data strobe signal and a second data strobe signal different in phase from said first data strobe signal, and
    said edge detecting circuit detects the transition timing based on the levels of two of first test data respectively latched in response to said first and second data strobe signals.

3. An operation method of a memory interface comprising:
    detecting a position of a first edge in an eye opening formed based on fluctuation of data;
    detecting a position of a second edge opposing to the first edge; and
    setting an intermediate position between the first edge and the second edge to a falling/rising position of a data strobe signal,
    wherein said detecting a position of a first edge comprises:
    writing a first test data in which at least two bits with a same sign succeed, in a memory in a normal mode;
    reading the written first test data from said memory;
    detecting a transition timing at which a level of the read first test data transits; and
    specifying a timing of the first edge of said eye opening based on said transition timing, and
    wherein said detecting a position of a second edge comprises:
    writing a second test data which contains only a single 1-bit lone pulse, in the memory in the normal mode;
    reading the written second test data from said memory;
    detecting whether or not the read second test data is coincident with an expectation area of data read/write expected based on the timing of the first edge of said eye opening; and
    detecting the position of the second edge based on said expectation area.

* * * * *